United States Patent
Hama et al.

(10) Patent No.: US 6,226,560 B1
(45) Date of Patent: May 1, 2001

(54) METHOD AND APPARATUS FOR OPTIMIZING THE PATH OF A PHYSICAL WIRE

(75) Inventors: Toshiyuki Hama, Tokyo-to; Hiroaki Etoh, Kawasaki, both of (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/012,765

(22) Filed: Jan. 23, 1998

Related U.S. Application Data

(63) Continuation-in-part of application No. 08/757,718, filed on Nov. 26, 1996, now Pat. No. 5,880,969, and a continuation-in-part of application No. 09/190,735, filed on Nov. 12, 1998.

(30) Foreign Application Priority Data

Mar. 4, 1996 (JP) .................................... 8-45764
Jan. 27, 1997 (JP) .................................... 9-012498

(51) Int. Cl.[7] .................................... G06F 19/00
(52) U.S. Cl. .................................... 700/97; 700/96; 700/98; 700/117; 700/121; 716/1; 716/5; 716/8; 716/9
(58) Field of Search .................................... 700/97, 98, 96, 700/109, 110, 117, 121; 716/1, 5, 8, 9, 11, 12, 13

(56) References Cited

U.S. PATENT DOCUMENTS

| | | | |
|---|---|---|---|
| 4,484,292 | * 11/1984 | Hong et al. | 716/1 |
| 5,438,166 | * 8/1995 | Carey et al. | 174/261 |
| 5,521,837 | * 5/1996 | Frankle et al. | 716/1 |
| 5,790,414 | * 8/1998 | Okano et al. | 716/12 |
| 5,880,969 | * 3/1999 | Hama et al. | 716/11 |
| 5,889,677 | * 3/1999 | Yasuda et al. | 716/6 |

OTHER PUBLICATIONS

"On Continuous Homotopic One Layer Routing" by Gao et al, Proceedings of the 4th Annual ACM Symposium on Computation Geometry, pp. 392–402, ACM, 1988.

"Automated Pin Grid Array Package Routing on Multilayer Ceramic Substrates" by Ying et al, IEEE Transaction on Very Large Scale Integration (VLSI) Systems, vol. 1, No. 4, pp. 571–575, 1993.

"Topological Routing in SURF: Generating a Rubber–Bank Sketch" by Dai et al, 28th Design Automation Conference, pp.39–44, 1991.

* cited by examiner

*Primary Examiner*—Paul P. Gordon
*Assistant Examiner*—Ramesh Patel
(74) *Attorney, Agent, or Firm*—Arthur J. Samodovitz

(57) ABSTRACT

A method and apparatus for transforming a topological wire route to a physical wire route is described where the topological wire is a connected route having only a topological position determined with respect to terminals or obstacles. A topological wire is first selected and then obstacles which sight the selected wire are identified. A fan with a radius that is a predetermined number times a minimum space is then set to the identified obstacle as a forbidden region. A minimum space must be left between the selected wire and the identified obstacle. Finally, a shortest route is detected so that it does not pass through the forbidden region, and the route of the physical wire on the board is determined with the shortest route.

22 Claims, 8 Drawing Sheets

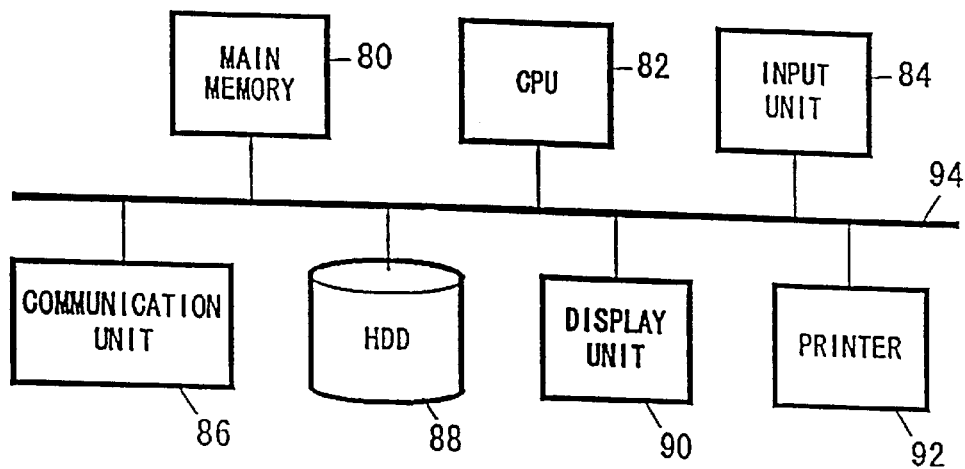
F I G. 10
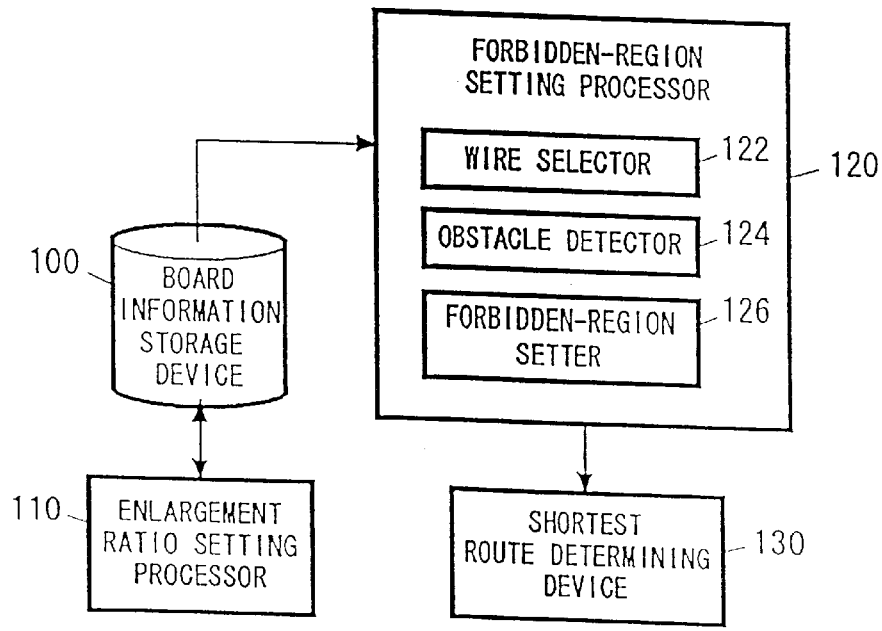
F I G. 11

METHOD AND APPARATUS FOR OPTIMIZING THE PATH OF A PHYSICAL WIRE

This is a continuation-in-part of Ser. No. 08/757,718 filed Nov. 26, 1996 by Hama et al. now U.S. Pat. No. 5,880,969 (which claims priority of Japanese patent application 8-045764 filed Mar. 4, 1996 by Hama et al.) and also a continuation-in-part of Ser. No. 09/190,735 filed Nov. 12, 1998 by Hama et. al. now pending.

TECHNICAL FIELD

The present invention relates generally to a method for routing wires or conductors on a printed-circuit board. This invention also relates to a method of enlarging the wire widths and wire spacings to optimize the surface area of the printed circuit board.

BACKGROUND OF THE INVENTION

Free-angle wiring is based on circular arcs and lines with Euclid distance and can utilize a wiring region more effectively than conventional rectilinear wiring or octilinear wiring. Where semiconductor chips are mounted on a printed-circuit board with high density, free-angle wiring will be very useful if it can be performed at high speed and automatically. A method of perfect free-angle wiring is described, for example, in Shaodi Gao, Mark Jerrum, Michael Kaufman, Kurt Mehlhorn, Wolfgang Rueling, and Christopher Storb, "On continuous homotopic one layer routing," in Proceedings of the 4th annual ACM Symposium on Computational Geometry, pages 392–402, ACM, 1988. However, there is no practical free-angle wiring method.

Techniques for even-spacing and wire-width enlargement are important in order to enhance the yield and the stability in electrical characteristics of pin-grid array (PGA) packages, ball-grid array (BGA) packages, and multi-chip modules (MCMs) in addition to printed-circuit boards which utilize very fine wires. For PGA packages, a method for automatically realizing even-spacing and wire-width enlargement has been reported (in Changsheng Ying and Jun Gu, "Automated pin-grid array package routing on multi-layer ceramic substrates," IEEE Transaction on Very Large Scale Integration (VLSI) SYSTEMS, 1(4), pages 571–575, 1993). However, in this method, wires are only line segments which extend radially from the center, there is also a grid-shaped array of pins, which is characteristic of PGA packages. Consequently, this method lacks extensibility. As a matter of course, there is no product which carries out even-spacing and wire-width enlargement by general free-angle wiring.

A general object of the present invention is to provide a practical method and apparatus for routing wires between terminals on a printed circuit-board or other substrate.

Another object of the present invention is to provide a practical free-angle wiring method and apparatus which also enlarges wire spacings and wire widths to fully utilize the available surface area of the board.

SUMMARY OF THE INVENTION

The present invention transforms a topological wire route to a physical wire route. (A topological wire route is a surface configuration of a conceptual wire that meets less than all routing criteria. A topological wire route can, for example, be defined relative to the positions of other wires, pads, or other obstacles on a printed circuit board. For example, a portion of a topological wire "a" can be defined as residing somewhere between topological wires "b" and "c" and another portion of the topological wire "a" can be defined as residing somewhere between topological wire "x" and pad "y".) A physical wire has a precise physical path on a board and should meet most if not all of the routing criteria. The transformation is achieved by (1) selecting a topological wire to be transformed, (2) generating a fan-shaped or arcuate forbidden region around each of various obstacles which includes pads, terminals, lands and other conductive regions, and (3) obtaining a shortest route for the selected wire so as not to pass through any of the forbidden regions. By enlarging the radius of the fan of this generated forbidden region, even-spacing and wire-width enlargement are realized.

According to one aspect of the invention, a topological wire is first selected. Then, obstacles which sight the selected topological wire are specified. A fan is set to each of the specified obstacles as a forbidden region, wherein each fan has a radius that is a predetermined number times minimum spacing that is required between each physical wire and each of the identified obstacles. The fan radius accounts for the wire widths and spacings between the selected topological wire and the identified obstacles. The physical wire is laid out along a shortest route which avoids forbidden regions. In this embodiment, when wire-width enlargement is performed, the right and left boundaries of the wire to be transformed are separately determined as the shortest route.

According to another aspect of the present invention, the foregoing determination of the forbidden regions is performed only for obstacles that "sight" the topological wire, i.e. "sight" means that a straight line can be drawn between the center of two obstacles and intersect the topological wire without the line being obstructed by another intervening obstacle.

In accordance with another aspect of the present invention, the radius of a fan-shaped forbidden region is enlarged to perform the even-spacing and enlargement of a wire. A factor is then identified for allocating surplus space on the board to enlargement of wire width and a factor for allocating surplus space to enlargement of wire spacing. By selecting wires which cross a critical cut between a first obstacle and a second obstacle and spacings of the wires, the upper limit of a wire width enlargement ratio relative to the second obstacle is determined in a range allowed by the factor for allocating to enlargement of wire width. In addition, the upper limit of a wire spacing enlargement ratio relative to the second obstacle is determined in a range allowed by the factor for allocating to enlargement of wire spacing. The lowest upper limit among the upper limits of the wire width enlargement ratios relative to obstacles which compose critical cuts with the first obstacle is stored as a wire width enlargement ratio of the first obstacle. In addition, the lowest upper limit among the upper limits of the wire spacing enlargement ratios relative to obstacles which compose critical cuts with the first obstacle is stored as a wire spacing enlargement ratio of the first obstacle. Furthermore, wires between a selected wire and the first obstacle are identified. The widths of the specified wires are enlarged by employing the wire width enlargement ratio set to the first obstacle, and the wire spacings between the specified wires are enlarged by employing the wire spacing enlargement ratio set to the first obstacle. The radius of the forbidden region is then calculated by adding the enlarged wire widths and the enlarged wire spacings for the specified wires.

BRIEF DESCRIPTION OF THE DRAWINGS

FIG. 10 is a block diagram describing an example of the structure of a computer for use in performing the various steps of the invention; and FIG. 11 is a block diagram describing an example of an apparatus which may serve to execute the method of the present invention.

DETAILED DESCRIPTION OF THE PREFERRED EMBODIMENT

Figure 1:
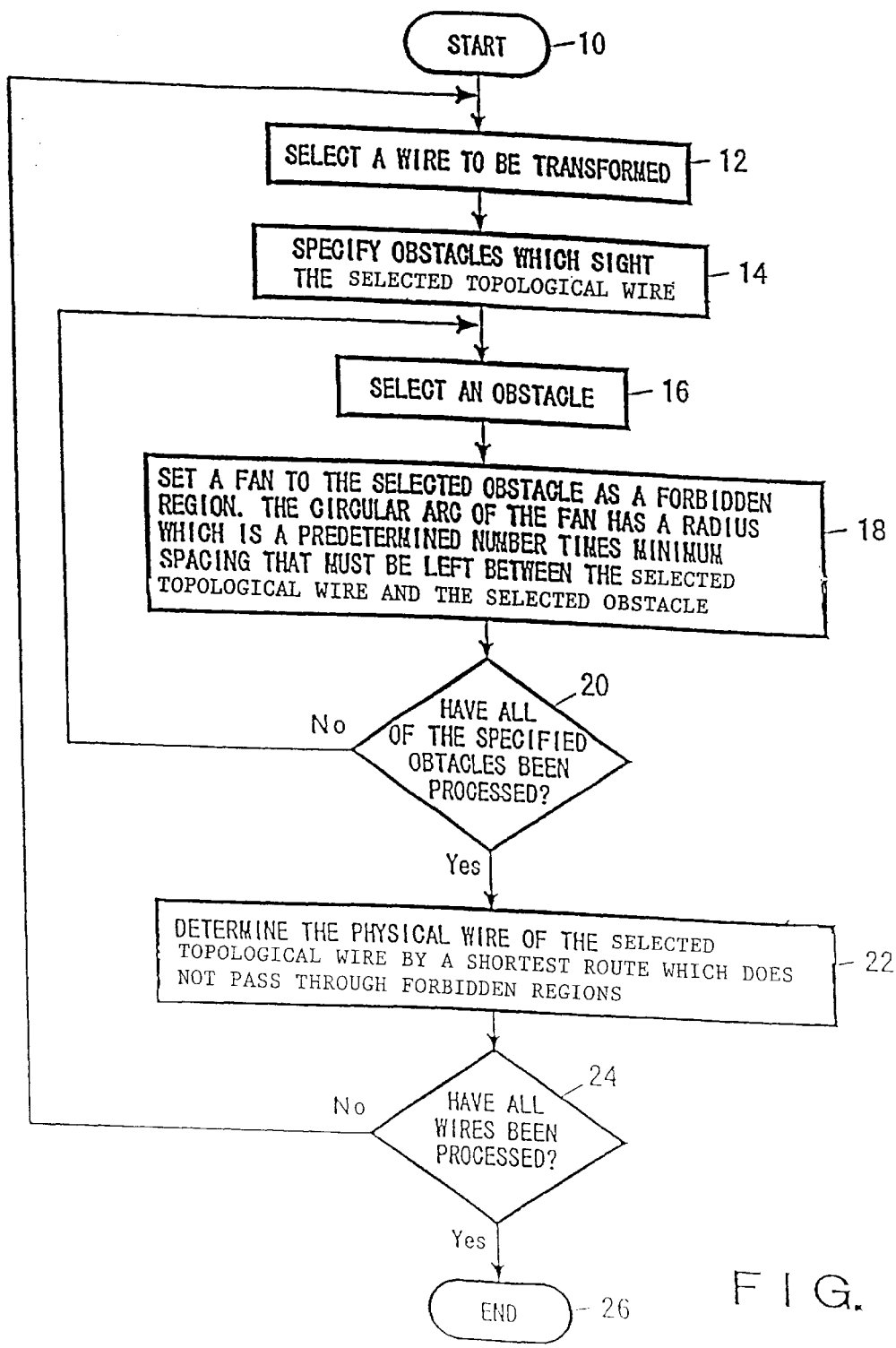
FIG. 1 is a flowchart describing the steps of the method of the invention according to one embodiment thereof.
Figure 2:
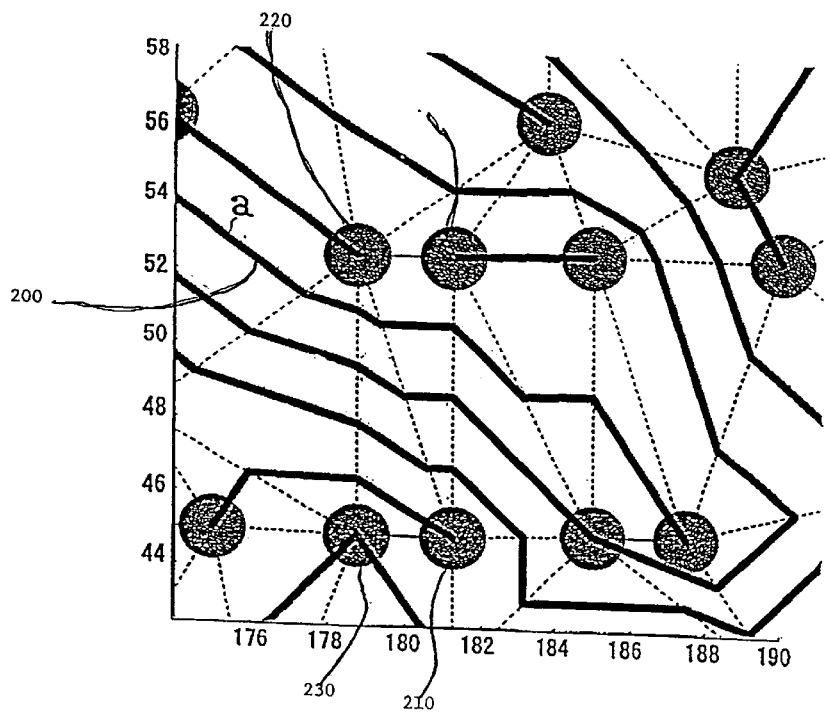
FIG. 2 is a diagram illustrating an example of topological wiring.

The basic processing flow of the invention will now be described. As previously described, it is assumed that topological wires have already been determined. For a paper on a method of determining these topological wires, there is, for example, an article by W. Dai, T. Dayan, and D. Staepelaere, entitled "Topological Rating in SURF: Generating a Rubber-Band Sketch," 28th DAC 1991, pp 39–44. This paper is hereby incorporated by reference as part of the present disclosure. Examples of topological wires are shown in FIG. 2. Referring to FIG. 1, initially, a single topological wire is selected (step 12). Then, obstacles that sight this topological wire 200 are specified (step 14). The obstacles that sight selected topological wires are determined by a method such as a plane sweep method. The plane sweep method, also called a scan-line method, is a basic algorithmic technique of computational geometry. When a line on a plane is moved and it intersects a region or object, an action is prompted. For a further description of the use of this technique, there is incorporated by reference as part of this disclosure an article entitled, "On continuous homotropic one layer routing" by Gao et al, Proceedings of the 4th Annual ACM Symposium on Computational Geometry, pp. 392–402, ACM, 1988. In an illustrated example, referring to FIG. 2, note that initially topological wire 200 is selected. Next obstacles 210 and 220 that sight this topological wire 200 are specified. An obstacle may sight a selected topological wire in two or more directions. Referring to obstacle 210, it is shown that it sights topological wire 200 in at least two directions. In such a case, there are situations where different wires are located between the selected topological wire and the obstacle depending on the direction of sighting. Therefore, if an obstacle sights a topological wire in different directions, it will be handled as different obstacles. Note that obstacles include both pads and other objects where wiring is forbidden on the circuit board. In the illustrative example, pads 210, 220, 230 and 240, all sight wire 200. Again referring to FIG. 1, among obstacles specified in step 14 one, such as obstacle 210, is selected first (step 16), and processing is performed from this obstacle.

In the next step, a "fan" or arcuate shaped region is defined around the selected obstacle 210 as a forbidden region (step 18). The radius of this fan is equal to a predetermined number times a minimum spacing. The minimum spacing is that spacing which must be left between the selected topological wire 200 and the selected obstacle 210. The minimum spacing is then determined by wires between the selected topological wire and the selected obstacle to avoid shorts or crosstalk. That is, the minimum spacing is determined by adding all of the widths of the wires between the selected topological wire and the selected obstacle and all of the requisite spacings between the wires to avoid shorts and crosstalk. The forgoing process is repeated for each obstacle that sights wire 200, then another topological wire is selected and the forgoing process is repeated for each obstacle that sights the other topological wires.

Then, in the preferred embodiment of the invention, a wire width enlargement ratio and/or a wire spacing enlargement ratio are set to each obstacle to which a forbidden region is set. In the case where only wire width is enlarged, only a wire width enlargement ratio will be used, and if only wire spacing is enlarged, only a wire spacing enlargement ratio will be used. Usually, both a wire width enlargement ratio and a wire spacing enlargement ratio are used. In the case where only a wire spacing enlargement ratio is to be used, all wire spacings between the selected topological wire and the selected obstacle are enlarged and added. Next, the widths, (determined in design rules) of all wires between the selected topological wire and the selected obstacle are added and, furthermore, half of the width of the selected topological wire is added. The sum of the enlarged wire spacings and the wire widths equals the radius of the fan shaped region, step 18. Half of the width of the selected topological wire is added so that a shortest distance route which is obtained in a subsequent step is the center line of the selected topological wire. On the other hand, in order to enlarge wire width, there is a need to compute the radii of two kinds of forbidden regions for determining boundaries on both sides of a wire. A description will hereinafter be made of the processing required when wire width and wire spacing are enlarged.

Figure 3:
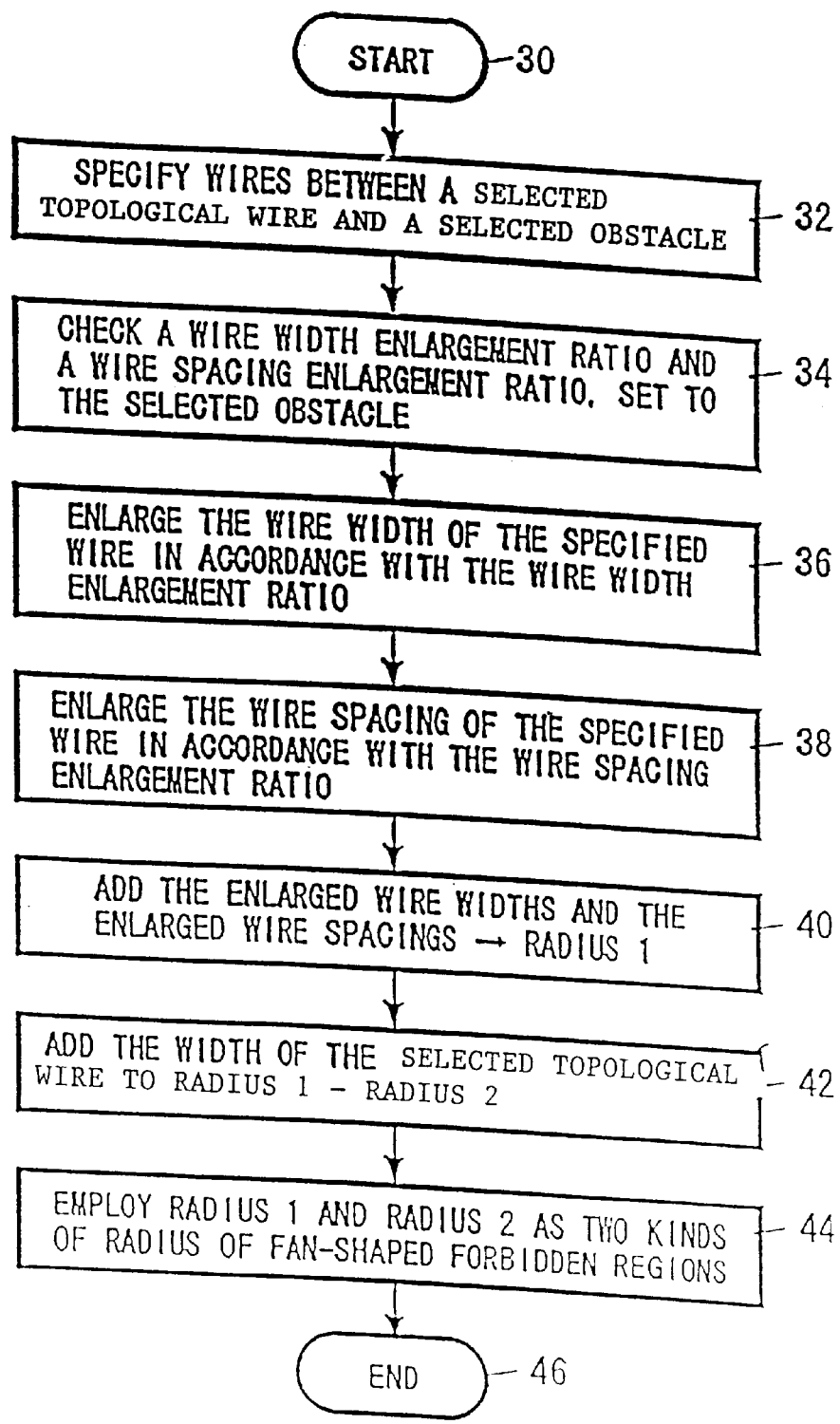
FIG. 3 is a flowchart describing in greater detail the processing flow of step 18 in FIG. 1.

Referring to FIG. 3, wires between the selected topological wire and the edge of the selected obstacle are specified (step 32) and the wire width enlargement ratio and the wire spacing enlargement ratio, set to the selected obstacle, are checked (step 34). Specifying wires can be carried out by a method such as the aforementioned plane sweep method. Then, the specified wire widths are enlarged according to the wire width enlargement ratio (step 36). and, the wire spacings between the specified wires are enlarged according to the wire spacing enlargement ratio (step 38). The wire spacings include all the spacing between the selected topological wire and the selected obstacle. The order of the steps 36 and 38 can be reversed from that shown. Radius 1 is then calculated by adding the enlarged widths of all wires and the enlarged wire spacings (step 40). This includes the distance between a predetermined point within the selected obstacle (a point which becomes the start point or end point of a critical cut: if an obstacle is circular in shape, the point is the center of the circle) and the outer boundary of the obstacle. Alternatively, the addition may be performed in order of the wires arranged between the selected obstacle and the selected topological wire; that is, in order of spacing, wire width, spacing, wire width, spacing, and so on. Finally, the wire width of the selected topological wire is added to the radius 1 (step 42). The wire width of this selected topological wire is also the wire width enlarged by the previously checked wire width enlargement ratio. This is designated as radius 2. Radius 1 and radius 2 are employed as the radii of a fan-shaped forbidden region (step 44). Radius 1 represents the boundary of the fan-shaped forbidden region on the selected obstacle side of the selected topological wire while radius 2 represents the boundary of the fan-shaped forbidden region on the opposite side of the selected topological wire.

Figure 4:
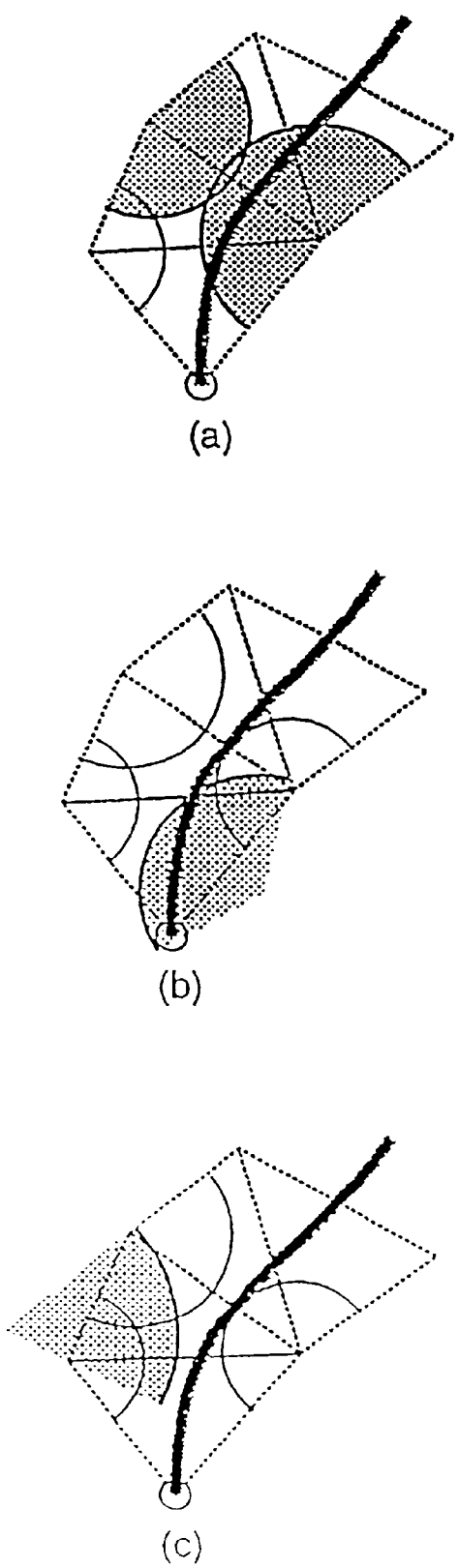
FIGS. 4a, 4b and 4c are diagram illustrating an example of the case where a problem arises due to the enlargement of a forbidden region.

If processing is performed as described above, an enlarged forbidden region is set to the obstacle that sights the selected topological wire. However, if the wire width enlargement ratio and the wire spacing enlargement ratio are not appropriate, there will be cases where such wiring will be impossible or a wire may extend unnecessary. For example, as shown in FIG. 4(a), if the opposite forbidden regions of a selected topological wire overlap each other, wiring cannot be performed. Similarly, as shown in FIG. 4(b), if a forbidden region overlaps the start point or end point of the topological wire, wiring cannot be performed. Furthermore, as shown in FIG. 4(c), if the edge of the circular arc of a forbidden region protrudes or overlaps from another forbidden region existing on the same side of the selected topological wire, the shortest distance between terminals may unnecessarily extend. Therefore, the wire width enlargement ratio and the wire spacing enlargement ratio need to be set so that the aforementioned problems will not occur. One example of a method for determining the wire width enlargement ratio and the wire spacing enlargement ratio will now be described in detail.

When performing high speed processing it is sometimes possible and advantageous to ignore some obstacles that are a predetermined distance from the selected topological wire. Although this does not improve computational complexity it can significantly improve the average time performance. Referring to FIG. 1, this selection is performed in step 14. It can also be performed in step 18. Once processing reaches step 20, it will either iterate back to step 16 if all the selected obstacles have not been processed or proceed to step 22. Step 22 routes a wire, a physical wire corresponding to the selected topological wire, around identified forbidden regions with the shortest possible route.

Figure 5:
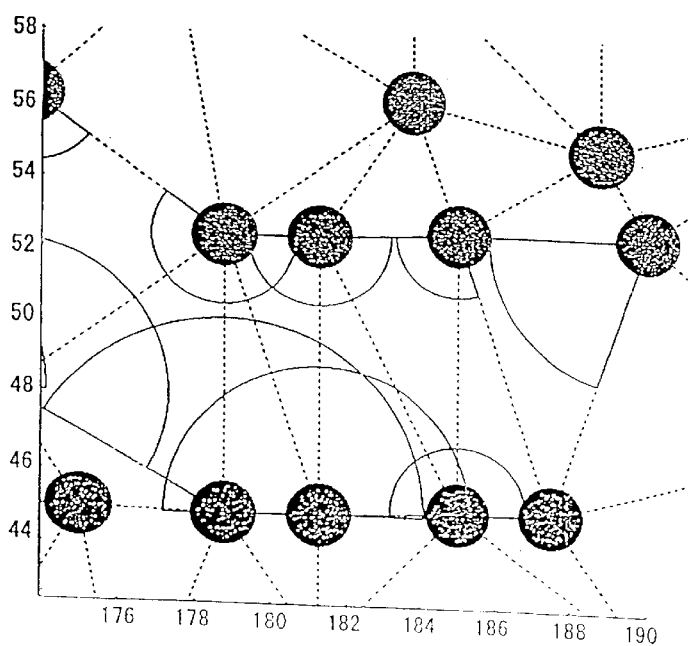
FIG. 5 is a diagram illustrating the case where several forbidden regions are set in the case of FIG. 2.
Figure 6:
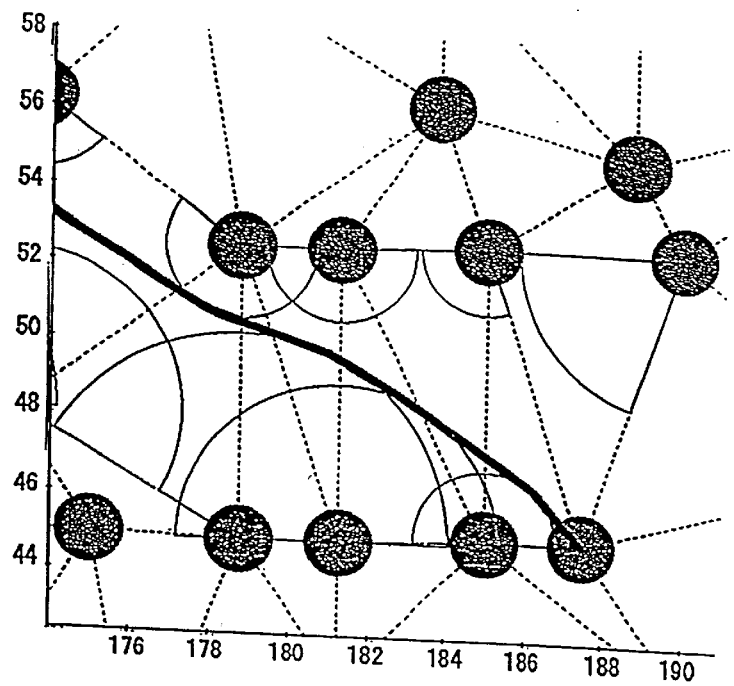
FIG. 6 is a diagram illustrating the case where a single physical wire is set according to the forbidden regions of FIG. 5.

When wire spacing is enlarged, the shortest route is the center line of the physical wire, and when wire width is enlarged, the physical wire of a selected topological wire that is bordered by radius 1 and radius 2 is the shortest route obtained by performing the process steps obtained in FIG. 3. By illustrative example, in order to transform a wire (200) shown in FIG. 2 to a physical wire in the case where forbidden regions shown in FIG. 5 are set, the physical wire can be connected along the shortest route between pads, as shown in FIG. 6 (FIG. 5 includes obstacles to which the forbidden regions described in this paragraph are set and only wire spacing is enlarged).

Figure 7:
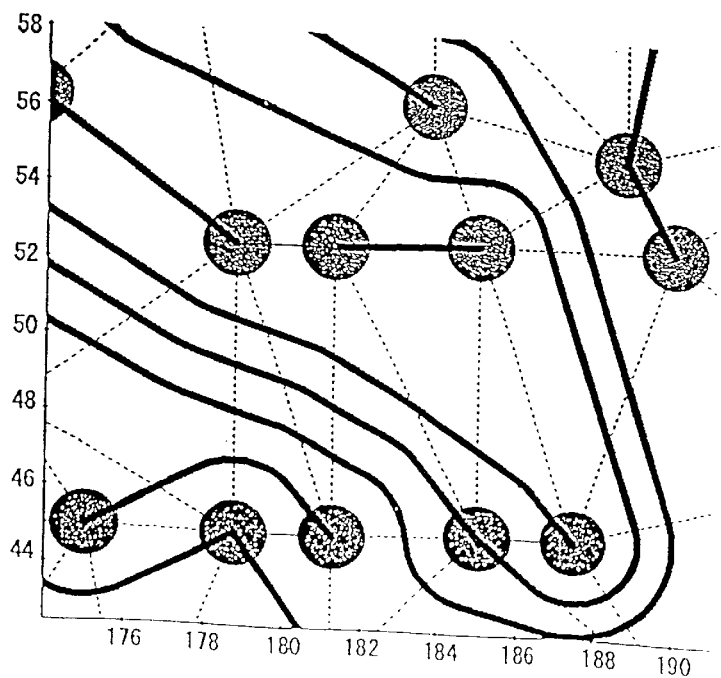
FIG. 7 is a diagram illustrating the case where all wires of FIG. 2 have been transformed to physical wires.
Figure 8:
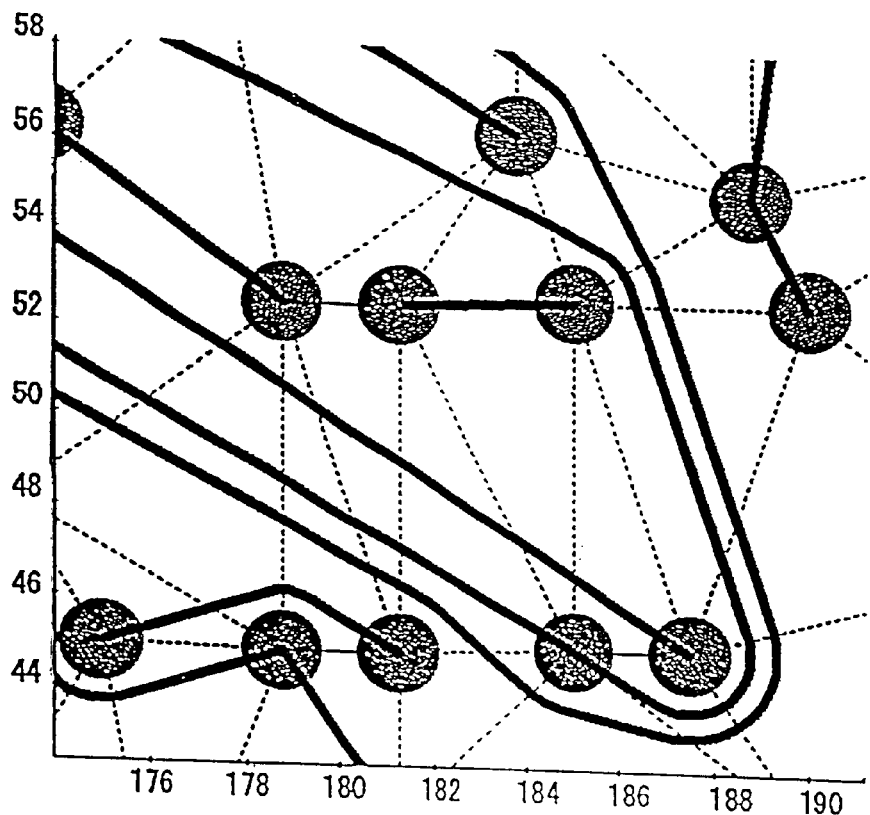
FIG. 8 is a diagram illustrating the case where all wires of FIG. 2 have been transformed to physical wires without enlarging forbidden regions, thereby substantially reducing the relative spacings between such wires at various locations there along.

In the next step (step 24) in FIG. 1, it is determined whether all wires have been processed. If there are still wires to be processed, step 24 returns back to step 12. If there is no wire to be processed, the processing will end (step 26). Topological wiring such as FIG. 2 will be transformed into physical wiring as shown in FIG. 7. FIG. 8 illustrates the case where shortest routes are connected before forbidden regions are enlarged. By comparison FIG. 7 illustrates the case where even-spacing has been executed (wire width enlargement has not been executed).

A method of setting a wire width enlargement ratio and a wire spacing enlargement ratio to each obstacle will now be described. In this embodiment, the enlargement ratios are set to each obstacle by performing the following processing before the aforementioned step 12 of FIG. 1. In this embodiment, although there is shown the case where wire width enlargement and even-spacing are executed at the same time, either wire width enlargement or even-spacing can be executed by appropriately setting parameters to be described later. First, let "α" be a wire spacing enlargement ratio, and let "β" be a wire width enlargement ratio. α and β are given the subscript of the number of an obstacle. Also, variables representing how the superfluous space (spare space left between two pads after subtracting the sum of the wire widths and the sum of the wire spacings of wires between these pads from the total space between the pads) on a board is allocated to wire spacing and wire width are defined as $D_C$ and $D_W$ (where $D_C + D_W \leq 1$).

Figure 9:
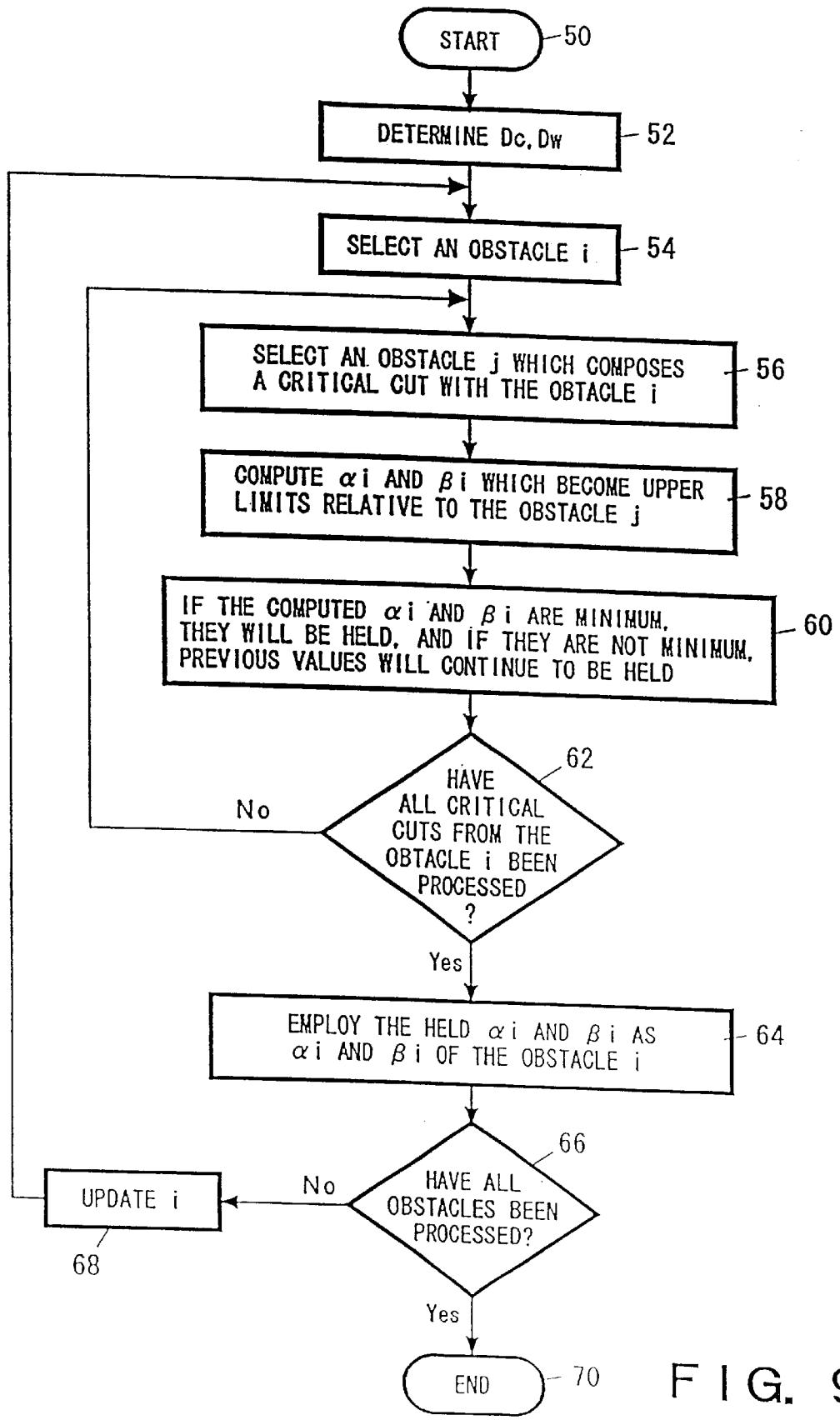
FIG. 9 is a flowchart describing an example of the computation of a wire width enlargement ratio and a wire spacing enlargement ratio using the teachings of the invention.

Referring to FIG. 9, the processing flow described therein is then carried out. Initially, the aforementioned variables $(D_C, D_W)$ are determined (step 52). That is, a user inputs $D_C$ and $D_W$ so that these satisfy $D_C + D_W \leq 1$. When only wire spacing is enlarged, $D_W$ is set to zero and $D_C$ to an arbitrary number less than 1. When, on the other hand, only wire width is enlarged, $D_C$ is set to zero and $D_W$ is set to an arbitrary number, again less than 1. The variables could be set to a value less than 1 because all of the superfluous space on a substrate need not be allocated to wire width and wire spacing, wire spacing, or wire width. Next, an obstacle "i" to which the enlargement ratio is set is selected (step 54). Then, an obstacle "j", which composes a critical cut with the obstacle "i", is selected (step 56). The critical cut means a line segment which connects the outer boundaries of two obstacles at the shortest distance. If plane sweeping is performed from the obstacle i, another obstacle j can be found. Then, $\alpha_i$ and $\beta_i$, which become upper limits relative to the obstacle j, are computed (step 58).

When the critical cut is determined, wires passing through the critical cut can be specified. The process of specifying wires can be carried out in a similar manner as the process of specifying wires between an obstacle and a topological wire. If the wires are specified in this way, the sum total of the wire widths and the sum total of the wire spacings will be obtained and these will be taken to $W_{ij}$ and $C_{ij}$, respectively. The superfluous length (spacing) $SS_{ij}$ with respect to the critical cut is expressed as follows:

$$SS_{ij} = \text{length}(CC_{ij}) - R_i - R_j - W_{ij} - C_{ij}$$

where $R_i$ is the radius of the obstacle i if it is a pad, i.e., the length from a predetermined point within the obstacle i (the start point or end point of the critical cut) to the intersecting point between the outer boundary of the obstacle and the critical cut, $R_j$ is the radius of the obstacle j if it is a pad, and length($CC_{ij}$) is the length of the critical cut $CC_{ij}$ between the obstacle i and the obstacle j. If this $S_{ij}$ is allocated to wire spacing and wire width with the ratio of the previously set $D_C$ and $D_W$, the upper limits of $\alpha_i$ and $\beta_i$ will be as follows:

$$\alpha_i = (D_C * SS_{ij} + C_{ij})/C_{ij}$$

$$\beta_i = (D_W * SS_{ij} + W_{ij})/W_{ij}$$

The $\alpha_i$ and $\beta_i$ values, obtained by such computation, are enlargement ratios such that a situation shown in FIG. 4(a)

does not occur with respect to the obstacle j. Also, when the obstacle j is a pad and a wire (which has a width wj) is drawn from the pad, the following computation is needed in order to obtain an enlargement ratio at which a situation shown in FIG. 4(b) does not occur. That is, superfluous spacing $SS'_{ij}$ becomes $SS'_{ij}$=length($CC_{ij}$)–$R_i$–wj/2–$W_{ij}$–$C_{ij}$ The upper limits of $\alpha_i$ and $\beta_i$ are as follows:

$$\alpha_i=(D_C * SS'_{ij}+C_{ij})/C_{ij}$$

$$\beta_i=(D_W * SS'_{ij}+W_{ij}+wj/2)/(W_{ij}+wj/2)$$

The aforementioned $SS'_{ij}$ allows that at least a single wire can be drawn from the obstacle j by reducing a forbidden region by a length of wj/2 from the center of a pad as in the case of FIG. 4(b). That is, a width through which a single wire can be drawn from the obstacle j is reserved as minimum spacing.

According to the aforementioned examples, the upper limits of $\alpha_i$ and $\beta_i$ with respect to the obstacle j are computed. If the result of this computation is smaller than the $\alpha_i$ and $\beta_i$ of the obstacle i computed before, this computation result will be held, and otherwise, current values will continue to be held (step 60, FIG. 9). The $\alpha_i$ and $\beta_i$ values for all obstacles j are held so the minimum value may be detected. The minimum value is used because situations such as shown in FIGS. 4(a) and (b) may arise somewhere.

If the processing up to this point is completed, it is judged whether all critical cuts from the obstacle i have been processed (step 62, FIG. 9). If all critical cuts have not been processed, step 62 returns to step 56. If these have been processed, the currently held $\alpha_i$ and $\beta_i$ values will be used as the wire spacing enlargement ratio and the wire width enlargement ratio of the obstacle i (step 64). Then, the aforementioned processing is carried out for all obstacles i (steps 66 and 68, FIG. 9).

With the aforementioned processing, a wire spacing enlargement ratio and a wire width enlargement ratio are set to each obstacle. If only the wire width is enlarged the wire spacing enlargement ratio becomes 1. Similarly if only even-spacing is performed the wire width enlargement ratio becomes 1.

Even though the method of FIG. 9 can accommodate the cases of FIGS. 4(a) and (b), the method cannot accommodate the case of FIG. 4(c). Therefore, before the aforementioned step 20 in FIG. 1 is carried out, it is checked, for each side of each selected topological wire, as to whether the edge of the circular arc of another forbidden region overlays an existing forbidden region. If this situation occurs, the radius is shortened in correspondence with the circular arc of the other forbidden region and the case of FIG. 4(c) will not occur.

This check involves searching from the first of two pads to be wired to the second and, if searching reaches the second pad, the searching is likewise performed from the second pad back to the first pad. In the case of FIG. 4(c), it is found that the right edge of the circular arc of a shaded forbidden region (when viewed from the center of the circular arc) overlays when searching is performed from the lower left side of the topological wire to the upper side. Then, searching is performed from the upper side to the lower side, and the edge of a overlying circular arc is checked. In this case, since the edge of the circular arc of the shaded forbidden region overlays only on one side, no overlying circular edge is found when searching is performed from the upper side to the lower side. Next, searching is performed from the lower right side of the topological wire to the upper side and from the upper side to the lower side. Also in this case nothing is found.

While one embodiment of the present invention has been described, the invention is not limited to the embodiment. For example, in the foregoing description, while the wire spacing enlargement ratio and the wire width enlargement ratio have been set to all obstacles and even-spacing and wire-width enlargement have been performed for all wires, it is also possible to set enlarged forbidden regions only to obstacles related to a specific wire. Although in the case just described the processing of FIG. 9 has been performed before step 12 in FIG. 1, it is possible to perform before step 18.

The present invention is realizable with an apparatus, such as a computer, which executes the aforementioned processing or with a program for processing the aforementioned steps. For example, such a computer is depicted in FIG. 10. The computer's main memory device 80, central processing unit 82, input unit 84 (including a mouse or a keyboard), communication unit 86 (including a modem), hard-disk drive (HDD) 88, display unit 90 (including a CRT display device or a liquid crystal display device), and printer 92 are interconnected through a bus 94. A sub-storage device such as a floppy disk drive FDD and a magneto-optical disk may be connected. In such a computer, a program for processing the aforementioned steps is stored in the hard-disk drive 88, and information on a printed-circuit board, such as positions of pads and topological wire routes, is also stored in the hard-disk drive 88. The program and the information on the board are loaded into the main memory device 80 and executed by the CPU 82. Parameters such as $D_C$ and $D_W$ are specified by the input unit 84. The result of the execution is displayed on the display unit 90 and can be sent to printer 92. The result of this execution is stored in the HDD 88. The communication unit 86 is used to input the information on a board or the program itself to the computer of FIG. 10 from a remote place or is used to output the result of the execution to a remote place which provided instructions for the execution. The aforementioned configuration is meant as an example only, the communication unit 86 although included is not absolutely necessary to carry out processing of the program discussed in the aforementioned steps. As emphasized above, the present invention has been based on the assumption that topological wires have been determined and therefore the determination of the topological wires has not been shown, but it is possible to store in hard-disk unit 88 a program which determines topological wires from information about the pad position on a board and information as to which pads are connected. It is also possible to execute the topological wiring determining program by CPU 82 and store the result in HDD 88.

An example of an apparatus for executing the aforementioned processing is shown in FIG. 11. A board information storage device 100, which stores board information regarding the position and size of obstacles such as pads and board information on the routes of topological wires, is connected to both an enlargement ratio setting processor 110 (which computes a wire width enlargement ratio and a wire spacing enlargement ratio which are set to each obstacle) and a forbidden-region setting processor 120 (which sets a forbidden region in accordance with the set enlargement ratios). The forbidden-region setting processor 120 is connected to a shortest route determining device 130. The enlargement ratio setting processor 110 computes the wire width enlargement ratio and the wire spacing enlargement ratio that are set to each obstacle by employing the board information stored previously in the board information storage device 100. The processor 110 stores the result in board information storage device 100. In forbidden-region setting processor 120, a wire selector 122 selects a wire and an obstacle detector 124 determines which obstacles sight the selected wire. Thereafter, a forbidden-region setter 126 sets a fan-shaped forbidden region having a radius which is a predetermined number times minimum spacing needed to be left between an obstacle and a wire. This processing is performed with the wire spacing enlargement ratio and the wire width enlargement ratio that are set to each obstacle by the enlargement ratio setting processor. The aforementioned process which copes with the case of FIG. 4(c) is also performed. If such forbidden regions are set, shortest route determining device 130 detects a shortest route which does not pass through the forbidden regions and then determines the position of a physical wire by employing the shortest route. The shortest route determining device 130 also executes the aforementioned process which copes with the case of FIG. 4(c).

FIG. 11 is an example of one embodiment of a structure which can perform the method of the present invention, but other structures are also possible. For example, the elements shown in FIG. 11 are needed as processing elements, but the target processing is executable without limiting the connection relationship and the processing blocks to those shown FIG. 11. Again, the present invention is based on the assumption that topological wires have been determined and therefore this information has been assumed to be stored in the board information storage device 100. It is also possible however, to provide a processing unit for determining topological wires from information on the positions of terminals on a board and information on which terminals are connected.

As has been described hereinbefore, the present invention does provide a new and unique method which enlarges wire spacing and wire width in a region where there exists enough room, while adopting free-angle wiring which can effectively use a wiring region. Additionally, the invention will also enhance the yield and electrical characteristics of printed-circuit boards etc., produced as a result of wiring.

It will be appreciated that, although specific embodiments of the invention have been described herein for purposes of illustration, various modifications may be made without departing from the spirit and scope of the invention.

We claim:

1. A method for transforming a topological wire route to a physical wire route on a printed circuit board, said method comprising the steps of:
   selecting a topological wire;
   identifying obstacles on both sides of said topological wire which sight said selected topological wire;
   determining a region about each of said identified obstacles; and
   determining a route of a physical wire between said obstacles without passing through said regions, said physical wire corresponding to said selected topological wire.

2. The method as set forth in claim 1, further comprising the steps of:
   identifying wires between said selected topological wire and one of said obstacles;
   identifying excess spacing between one of said identified wires and other of said identified wires, said topological wire and said obstacle; and
   enlarging wire widths of said identified wires to utilize some or all of said excess spacing.

3. The method as set forth in claim 2, further comprising the steps of changing the sizes of each of said regions to accommodate said enlarged wire widths.

4. The method as set forth in claim 2, wherein the step of enlarging wire width further comprises the steps of;
   determining where said identified wires cross a critical cut between said one obstacle and another of said obstacles;
   determining for each of said identified wires a multiplicity of upper limits of enlargement ratios relative to a respective multiplicity of obstacles; and
   enlarging each of said identified wires based on the respective lowest upper limit.

5. The method as set forth in claim 2, wherein the step of enlarging wire widths of said identified wires further comprises the steps of:
   enlarging a region of one of said obstacles on one side of said selected topological wire; and
   enlarging said region of said obstacle on the other side of said selected topological wire.

6. The method as set forth in claim 1, wherein said regions are arcuate shaped.

7. The method as set forth in claim 1, further comprising the steps of:
   identifying wires between said selected topological wire and one of said obstacles;
   identifying excess spacing between one of said identified wires and other of said identified wires, said topological wire, and said obstacle; and
   enlarging spacings between said identified wires, said topological wire and said obstacle to utilize some or all of said excess spacing.

8. The method as set forth in claim 7, further comprising the steps of changing the sizes of each of said regions to accommodate said enlarged wire spacings.

9. The method as set forth in claim 7, wherein the step of enlarging wire spacing further comprises the steps of;
   determining where said identified wires cross a critical cut between said one obstacle and another of said obstacles;
   determining for each of said identified wires a multiplicity of upper limits of enlargement ratios relative to a respective multiplicity of obstacles; and
   enlarging spacings between said identified wires, said topological wire, and said obstacle based on the respective lowest upper limit.

10. The method as set forth in claim 1, further comprising the steps of:
    determining whether one of said regions overlaps another of said regions on the same side of said selected topological wire; and
    if said region overlaps said other region, modifying said overlapping region so that said region does not overlap said other region.

11. A method for transforming a topological wire route to a physical wire route on a printed circuit board, said method comprises the steps of:
    specifying a first factor by which surplus space on said printed circuit board is allocated to enlargement of wire width and second factor by which the surplus space is allocated to enlargement of wire spacing;
    identifying wires which cross a critical cut between an obstacle and another obstacle and lie between a selected topological wire and said obstacle;
    determining for each of said identified wires a multiplicity of upper limits of wire width enlargement ratios and wire spacing enlargement ratios relative to a multiplicity of obstacles;

enlarging widths of each of said identified wires based on the lowest upper limit of said wire width enlargement ratios relative to the respective obstacle;

enlarging wire spacings between each of said identified wires based on the lowest upper limit of wire spacing enlargement ratios relative to the respective obstacle; and adding the enlarged wire widths and the enlarged wire spacings to determine said enlarged region about said first obstacle.

12. The method as set forth in claim 11, wherein said enlarged region is arcuate shaped.

13. An apparatus for transforming a topological wire route to a physical wire route on a circuit board, said apparatus comprising:

means for selecting a topological wire;

means for identifying obstacles on both sides of said topological wire which sight said selected topological wire;

means for determining a region about each of said identified obstacles; and means for determining a route of a physical wire between said obstacles without passing through said regions, said physical wire corresponding to said selected topological wire.

14. The apparatus as set forth in claim 13, wherein said region is arcuate shaped.

15. The apparatus as set forth in claim 13, further comprising:

means for identifying wires between said selected topological wire and one of said obstacles;

means for identifying excess spacing between one of said identified wires and other of said identified wires, said topological wire, and said obstacle; and means for enlarging wire widths of said identified wires to utilize some or all of the excess spacing.

16. The apparatus as set forth in claim 15, wherein said means for enlarging wire widths of said identified wires further comprises:

means for enlarging a region of one of said obstacles on one side of said selected topological wire; and means for enlarging said region of said obstacle on the other side of said selected topological wire.

17. The apparatus as set forth in claim 13, further comprising:

means for identifying wires between said selected topological wire and one of said obstacles;

means for identifying excess spacing between one of said identified wires and other of said identified wires, said topological wire, and said obstacle; and means for enlarging spacings between said identified wires and said obstacle to utilize some or all of the excess spacing.

18. The apparatus as set forth in claim 13, further comprising:

means for determining whether one of said regions overlaps another of said regions on a same side of said topological wire; and processor means, responsive to said one region overlapping said other region, for modifying said overlapping region so that said one region does not overlap said other region.

19. An apparatus for transforming a topological wire route to a physical wire route on a printed circuit board, said apparatus comprising:

means for specifying a first factor by which surplus space on said board is allocated to enlargement of wire width and a second factor by which the surplus space is allocated to enlargement of wire spacing;

means for identifying wires which cross a critical cut between one obstacle and another obstacle and lie between an identified topological wire and said one obstacle;

means for determining for each of said identified wires a multiplicity of upper limits of wire width enlargement ratios and wire spacing enlargement ratios relative to a multiplicity of obstacles;

means for enlarging widths of each of said identified wires based on the lowest upper limit of said wire width enlargement ratios relative to the respective obstacle;

means for enlarging wire spacings between said identified wires based on the lowest upper limit of wire spacing enlargement ratios relative to respective obstacle; and means for adding the enlarged wire widths and the enlarged wire spacings to determine said enlarged region about said one obstacle.

20. The apparatus as set forth in claim 19, wherein said enlarged region is arcuate shaped.

21. A computer program product for transforming a topological wire route to a physical wire route on a printed circuit board, said program product comprising:

a computer readable storage medium;

first program instruction means for instructing a processor to select a topological wire;

second program instruction means for instructing a processor to identify obstacles on both sides of said topological wire which sight selected topological wire;

third program instruction means for instructing a processor to determine a region about each of the identified obstacles; and fourth program instruction means for instructing a processor to determine a route of a physical wire between said obstacles without passing through said regions, said physical wire, corresponding to said selected topological wire; and wherein all of said program instruction means are recorded on said storage medium.

22. A computer program product for transforming a topological wire route to a physical wire route on a printed circuit board, said program product comprising:

a computer readable storage medium;

a first program instruction means for instructing a processor to specify a first factor by which surplus space on said printed circuit board is allocated to enlargement of wire width and a second factor by which the surplus space is allocated to enlargement of wire spacing;

a second program instruction means for instructing a processor to identify wires which cross a critical cut between one obstacle and another obstacle and lie between an identified topological wire and said one obstacle;

a third program instruction means for instructing a processor to determine for each of said identified wires a multiplicity of upper limits of wire width enlargement ratios and wire spacing enlargement ratios relative to a multiplicity of obstacles;

a fourth program instruction means for instructing a processor to enlarge widths of each of said identified wires based on the lowest upper limit of wire width enlargement ratios relative to the respective obstacle;

a fifth program instruction means for instructing a processor to enlarge each of said wire spacings between said identified based on the lowest upper limit of wire spacing enlargement ratios relative to the respective obstacle; and a sixth program instruction means for instructing a processor to add the enlarged wire widths and the enlarged wire spacings to determine said enlarged region about said one obstacle;

and wherein all of said program instruction means are recorded on said storage medium.

* * * * *